(12) United States Patent
Martin et al.

(10) Patent No.: US 6,639,423 B2
(45) Date of Patent: Oct. 28, 2003

(54) CURRENT MODE DRIVER WITH VARIABLE TERMINATION

(75) Inventors: Aaron K. Martin, Hillsboro, OR (US); Bryan K. Casper, Hillsboro, OR (US); Stephen R. Mooney, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/096,546

(22) Filed: Mar. 12, 2002

(65) Prior Publication Data

US 2003/0173992 A1 Sep. 18, 2003

(51) Int. Cl.[7] .............................................. H03K 17/16
(52) U.S. Cl. .............................. 326/30; 326/86; 326/90; 370/282; 370/284; 375/219
(58) Field of Search .............................. 326/30, 86, 90, 326/83; 370/282, 284; 375/219, 220

(56) References Cited

U.S. PATENT DOCUMENTS 6,208,161 B1 * 3/2001 Suda ........................... 326/30
6,304,106 B1 * 10/2001 Cecchi et al. ................. 326/86
6,344,756 B1 * 2/2002 Cecchi et al. ................. 326/26

* cited by examiner

*Primary Examiner*—Michael Tokar
*Assistant Examiner*—Vibol Tan
(74) *Attorney, Agent, or Firm*—Schwegman, Lundberg, Woessner & Kluth, P.A.

(57) ABSTRACT

A simultaneous bidirectional port circuit includes a current mode output driver for driving an output node and a current mode return driver for driving a differential receiver. Variable impedance termination devices are included to provide terminations for both the current mode output driver and current mode return driver. A control circuit and method set the impedance value of the variable impedance termination devices by comparing voltage values at the output of the current mode output driver and current mode return driver.

30 Claims, 6 Drawing Sheets

CURRENT MODE DRIVER WITH VARIABLE TERMINATION

FIELD

The present invention relates generally to integrated circuit interfaces, and more specifically to integrated circuit interfaces having current mode drivers.

BACKGROUND

Integrated circuits typically have dedicated interface circuits to communicate with other integrated circuits and other systems. These dedicated interface circuits are typically interconnected with conductors, commonly referred to as "signal lines" or "traces," that carry signals from one integrated circuit to another. Some signal lines are "terminated" with a termination impedance that approximates the characteristic impedance of the signal line. These terminations can increase communication reliability by reducing unwanted signal reflections on the signal line. When the characteristic impedance of a signal line is uniform across its length, and the termination impedance "matches" the characteristic impedance of the signal line, signal reflections can be substantially reduced.

Signals that travel from one integrated circuit to another are becoming faster and faster. As signal speeds increase, the effects (unwanted reflections) of poorly terminated signal lines become more pronounced, and proper terminations become more important. In prior systems, signal lines are commonly terminated using external resistors coupled to the signal line outside the integrated circuit. These external resistors can.reduce reflections if chosen carefully, but can also take up a significant amount of space outside the integrated circuits. In systems that include many signal lines in need of termination, external resistors can consume a prohibitively large amount of space.

In addition to consuming space, external resistors typically require a system designer to compromise the quality of the termination. Signal line impedances vary from system to system, and external resistors typically exist at standard impedance values, thereby forcing the system designer to include external resistors that provide a compromised signal line termination.

For the reasons stated above, and for other reasons stated below which will become apparent to those skilled in the art upon reading and understanding the present specification, there is a need in the art for alternate integrated circuit interfaces and terminations.

DESCRIPTION OF EMBODIMENTS

Figure 1:
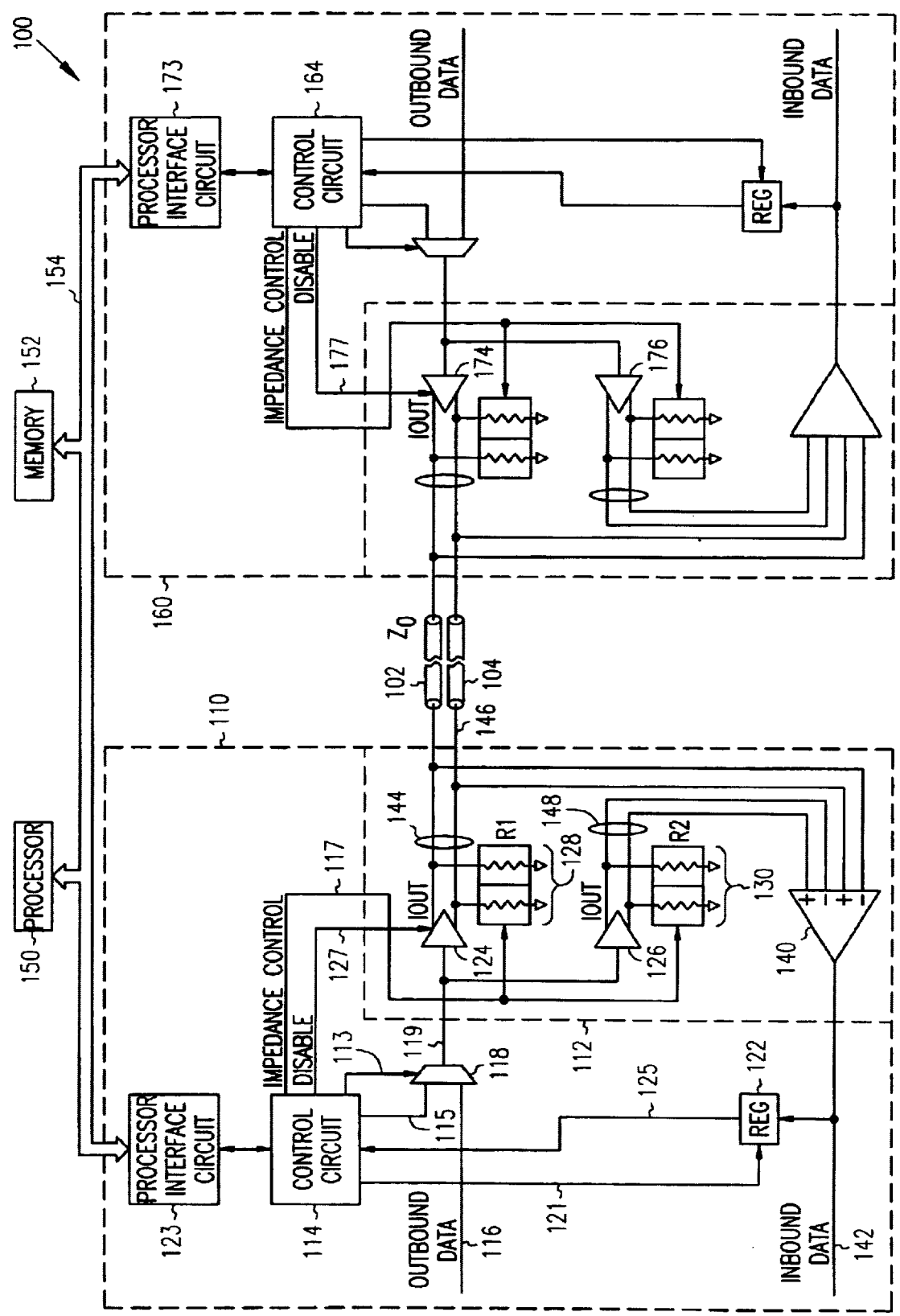
FIG. 1 shows an electronic system having two integrated circuits with simultaneous bidirectional port circuits.

In the following detailed description of the embodiments, reference is made to the accompanying drawings which show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the full scope of equivalents to which such claims are entitled.

In some embodiments, the method and apparatus of the present invention provide a simultaneous bidirectional port circuit that includes a current mode output driver for driving an output node and a current mode return driver for driving a differential receiver. In some of these embodiments, the current mode output driver has a variable termination impedance that can be set by a control circuit or processor. The variable termination impedance can be set by the control circuit or processor by causing the current mode output and return drivers to drive a current, and then comparing output voltages of the two drivers using the differential receiver. The variable termination impedance can be modified in response to the comparison.

FIG. 1 shows an electronic system having two integrated circuits with simultaneous bidirectional port circuits. System 100 includes processor 150, memory 152, and integrated circuits 110 and 160 interconnected by bus 154. Bus 154 is any type of bus suitable to provide a communications path between processor 150 and the other devices shown in FIG. 1. In addition to bus 154, integrated circuits 110 and 160 are interconnected by conductors 102 and 104. In the embodiments represented by FIG. 1, conductors 102 and 104 are transmission lines having a characteristic impedance of $Z_0$. Integrated circuits 110 and 160 communicate bidirectionally and simultaneously, each using both conductors 102 and 104.

Simultaneous bidirectional port circuits are shown within both integrated circuits 110 and 160. For simplicity, only one simultaneous bidirectional port circuit is shown in each of integrated circuits 110 and 160. In some embodiments, multiple simultaneous bidirectional ports exist, and a bus is formed from multiple pairs of conductors between integrated circuits 110 and 160. The simultaneous bidirectional port circuit within integrated circuit 110, and the operation thereof, are explained below. This explanation also applies to the simultaneous bidirectional port circuit within integrated circuit 160.

In some embodiments, processor 150, memory 152, and integrated circuits 110 and 160 are each separate integrated circuits. In some of these embodiments, processor 150 and memory 152 are arranged in a multi-chip module (MCM) and integrated circuits 110 and 160 are separate integrated circuits. In other embodiments, processor 150, memory 152, and one of integrated circuits 110 and 160 are implemented as a single integrated circuit.

Processor 150 can be any type of processor capable of communicating with memory 150 and integrated circuits 110 and 160. Examples include, but are not limited to, a microprocessor, a digital signal processor, a graphics controller, and a microcontroller. Memory 152 can be any type of article having a machine readable medium, such as a floppy disk, a hard disk, a random access memory (RAM), a read only memory (ROM), or a compact disc ROM (CD-ROM). In some embodiments, processor 150 reads instructions from memory 152 to perform method embodiments of the present invention. Various method embodiments of the present invention are discussed in more detail below.

Integrated circuit 110 includes simultaneous bidirectional port circuit 112, control circuit 114, multiplexor 118, register 122, and processor interface circuit 123. Simultaneous bidirectional port circuit 112 includes current mode output driver 124, current mode return driver 126, differential receiver 140, and variable impedance termination devices 128 and 130. Outbound data on node 119 is data generated within integrated circuit 110 that is to be transmitted through conductors 102 and 104. Current mode output driver 124 receives the data on node 119 and drives differential data lines 144. Differential data lines 144 exit integrated circuit 110 at external differential data nodes 146, and drive conductors 102 and 104. Differential data lines 144 also feedback into integrated circuit 110, and drive a differential input node of differential receiver 140. Current mode return driver 126 receives the data on node 119, and drives differential data lines 148. Differential data lines 148 do not drive nodes off integrated circuit 110, but do feedback into integrated circuit 110 to drive a second differential input node of differential receiver 140.

Data on node 119 can drive current mode output driver 124 and current mode return driver 126 to one of multiple logical states. Drivers 124 and 126 are current mode drivers that switch current between two outputs. For example, current mode output driver 124 switches current between differential data lines 144 as a function of the logical state of data on node 119. Likewise, current mode return driver 126 switches current between differential data lines 148 as a function of the logical state of data on node 119.

Differential receiver 140 has two sets of differential input nodes, one coupled to differential data lines 144, and the other coupled to differential data lines 148. Differential data lines 144 include data driven by both integrated circuits 110 and 160. In contrast, data lines 148 only include data driven by integrated circuit 110. Differential receiver 140 subtracts the differential voltage on differential data lines 148 from a differential voltage on differential data lines 144 to produce inbound data on node 142. Inbound data on node 142 represents the outbound data sent from integrated circuit 160 to integrated circuit 110 across the simultaneous bidirectional interface.

As previously described, drivers 124 and 126 are current mode drivers that switch currents between output nodes as a function of the logical state of the input node. Current mode output driver 124 drives a differential current on differential data lines 144. This differential current is terminated by the characteristic impedance ($Z_0$) of conductors 102 and 104, and the impedance ($R_1$) of variable impedance termination devices 128. Therefore, current mode output driver 124 is terminated with an impedance equal to the parallel combination of $Z_0$ and $R_1$. In contrast, current mode return driver 126 drives differential data lines 148 which are terminated only by variable impedance termination devices 130 having an impedance value of $R_2$.

In some embodiments, the impedance values of variable impedance termination devices 128 and 130 are scaled relative to each other and in combination with the current drive of drivers 124 and 126 to provide voltage scaling at the input to differential receiver 140. For example, in some embodiments, $R_2$ is a higher impedance value than the parallel combination of $R_1$ and $Z_0$, thereby allowing less current drive to be provided by current mode return driver 126 while maintaining the proper voltage level for comparison at differential receiver 140. In example circuit configurations that are discussed below, $R_2$ is substantially equal to $2R_1$.

In embodiments represented by FIG. 1, Driver 124 has an output current of $I_{out}$. Also in some embodiments, driver 126 is a scaled version of driver 124 that provides less current and saves power. In the embodiments of FIG. 1, driver 126 is scaled by a factor of ¼, and has an output current of $I_{out}/4$. In other embodiments, the scale factor is other than ¼.

Continuing with the discussion of embodiments in which driver 124 has a current of $I_{out}$, driver 126 has a current of $I_{out}/4$, and $R_2 = 2R_1$, example impedance values are now presented to aid in an understanding of the circuit operation. In one embodiment, conductors 102 and 104 are transmission lines having a characteristic impedance of 50 ohms, variable impedance termination devices 128 are resistors having a value of 50 ohms, and variable impedance termination devices 130 are resistors having a value of 100 ohms. Driver 124 drives an impedance of 25 ohms, which is equivalent to a resistor of 50 ohms in parallel with a transmission line of 50 ohms. Driver 126 drives an impedance equal to 100 ohms which is four times the impedance driven by driver 124. Because driver 126 drives one fourth the current into four times the impedance, the voltage developed by driver 126 is substantially equal to the voltage developed by driver 124.

In practice, the characteristic impedance of conductors 102 and 104 varies from system to system. For example, integrated circuits 110 and 160 might be used by one system designer that places them in a system with $Z_0$ equal to 50 ohms, or they might be used by another system designer that places them in a system with $Z_0$ equal to 100 ohms. Also for example, the characteristic impedance of conductors 102 and 104 might vary from system to system in the same design based on manufacturing variations.

The combination of control circuit 114, register 122, and multiplexor 118 work with simultaneous bidirectional port circuit 112 to set the values of variable impedance termination devices 128 and 130 to satisfy the relationship as described above. Control circuit 114 can impose test data on node 119 by steering multiplexor 118 using a control signal on node 113 and providing test data on node 115. Control circuit 114 can also sample the output of differential receiver 140 using register 122. By asserting a control signal on node 121, control circuit can cause register 122 to provide a sample on node 125. Control circuit 114 also controls the impedance of variable impedance termination devices 128 and 130 using an impedance control signal on node 117. In some embodiments, node 117 includes many physical connections, or "traces," to control variable impedance termination devices 128 and 130. A variable impedance device suitable to accept impedance control signals on node 117 is described below with reference to FIG. 4.

Continuing the discussion of the example circuit in which $R_2=2R_1$ and $Z_0=50$ ohms, in operation, system 100 works to set the impedance of variable impedance termination devices 128 and 130 to 50 ohms and 100 ohms, respectively. One method embodiment useful to set the values of variable impedance termination devices 128 and 130 is now described with reference to the flowchart shown in FIG. 2.

Figure 2:
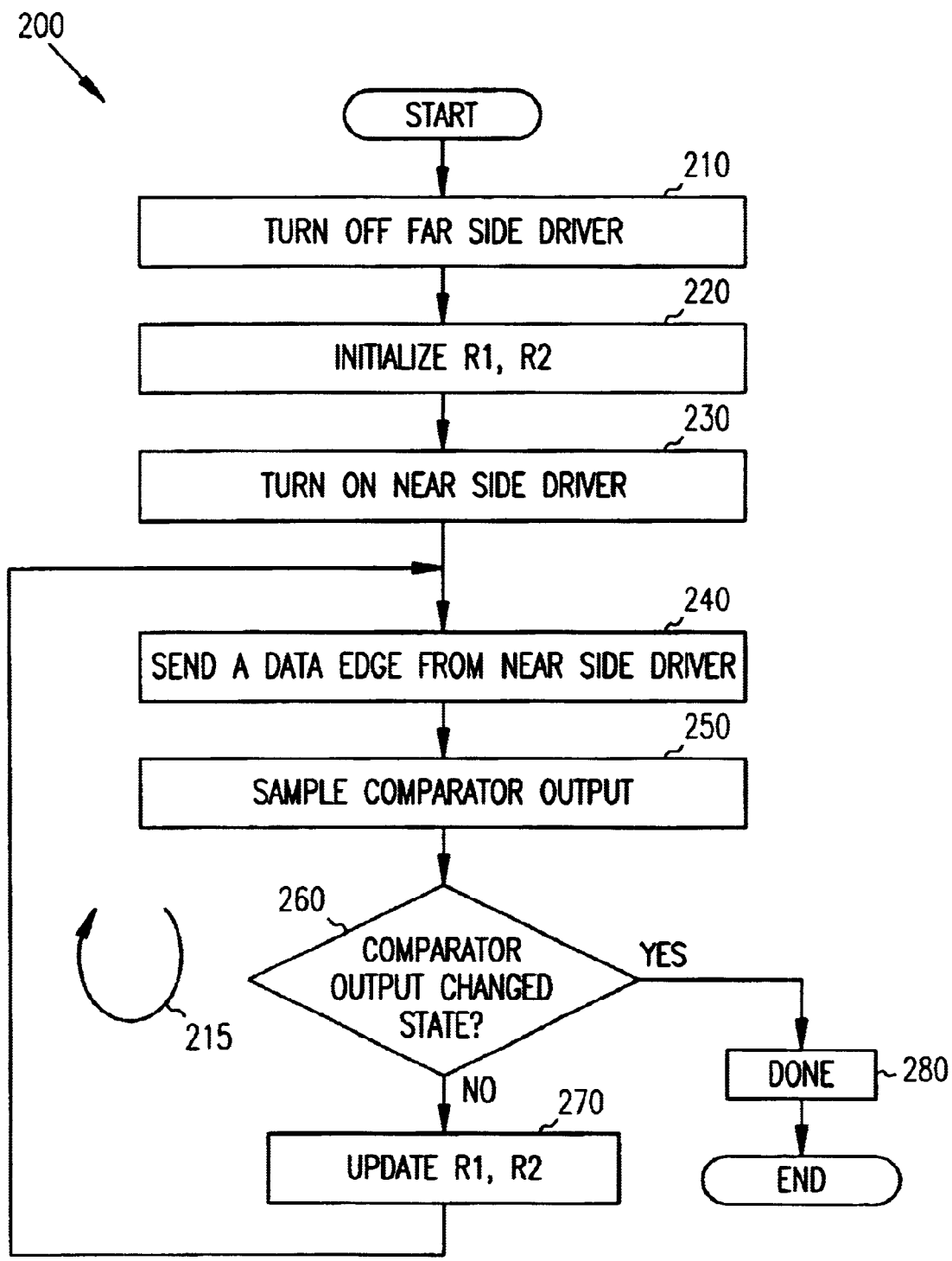
FIG. 2 shows a flowchart of a method to set the termination impedance in a simultaneous bidirectional port circuit.

FIG. 2 shows a flowchart of a method to set the termination impedance in a simultaneous bidirectional port circuit. Method 200 can be performed by a processor in a system, or can be performed by control circuits within integrated circuits that include variable impedance termination devices. For example, in some embodiments, processor 150 communicates with integrated circuits 10 and 160 (FIG. 1), using processor interface circuits such as processor interface circuits 123 and 173, and performs some or all of the actions of method 200. Also for example, in other embodiments, control circuits such as control circuits 114 and 164 (FIG. 1) perform some or all of the actions in method 200. Embodiments that distribute the actions of method 200 between a processor and a control circuit are now described.

Method 200 is described as a method to set the variable impedance termination devices in integrated circuit 110 (FIG. 1), but is equally applicable to integrated circuit 160. For the purposes of description, driver 124 in integrated circuit 110 is referred to as the "near side" driver, and driver 174 in integrated circuit 160 is referred to as the "far side" driver. This terminology is used to differentiate between the drivers in the discussion, and is not meant to indicate actual placement of the drivers.

In action 210 of method 200, the far side driver is turned off. This corresponds to processor 150 communicating with integrated circuit 160, and commanding processor interface 173 to disable driver 174 using the disable signal on node 177. In some embodiments, when driver 174 is turned off, driver 174 does not source or sink current on conductors 102 and 104. In these embodiments, driver 174 presents a high impedance to conductors 102 and 104. In some embodiments, action 210 also sets the far side variable impedance termination devices to a known value. In some of these embodiments, the known value is a high impedance, so that very little DC current, if any, exists on conductors 102 and 104.

In action 220, variable impedance termination devices 128 ($R_1$) and 130 ($R_2$) are initialized. This action corresponds to processor 150 commanding integrated circuit 110 to set the impedance values using processor interface 123, control circuit 114, and node 117. In some embodiments, $R_1$ and $R_2$ are initialized to values smaller than the expected final value, and in other embodiments, $R_1$ and $R_2$ are initialized to values larger than the expected final value. In action 230, the near side driver is turned on. This corresponds to processor 150 communicating with integrated circuit 110, and commanding driver 124 to turn on and drive currents on conductors 102 and 104 in response to data on node 119. After action 230, method 200 enters loop 215. Loop 215 includes actions 240, 250, and 270, and decision block 260.

In action 240, a data edge is sent from the near end driver. This corresponds to control circuit 114 steering multiplexor 118 to drive node 119 with the test data received on node 115, and then causing a data transition on node 115. When a data transition occurs, driver 124 drives a data edge out to the parallel combination of variable impedance termination devices 128 and conductors 102 and 104. Conductors 102 and 104 have a "transit time" associated with their length. The data edge travels from the near end to the far end during the transit time, and then reflects from the far end and a reflection returns after a second transit time. The sum of the transit time and the second transit time is referred to as the "round-trip transit time." Prior to the reflection returning after the round-trip transit time, driver 124 is terminated by the parallel combination of $R_1$ and $Z_0$, and the voltage developed on nodes 144 at the input to differential receiver 140 is a function of this parallel combination, and is not a function of any termination on the far end.

Driver 126 also sends a data edge as a result of action 240. The data edge sent by driver 126 is terminated by variable impedance devices 130, and the voltage developed on nodes 148 at the input to differential receiver 140 is a function of the current sourced by driver 126 and the impedance $R_2$. Differential receiver 140 operates as a comparator that compares the differential voltages on nodes 144 and 148. In action 250 the comparator output is sampled. This corresponds to control circuit 114 sampling the output of differential receiver 140 using register 122. In some embodiments, this part of method 200 is performed by dedicated hardware such as control circuit 114 because the comparator output is sampled prior to the round-trip transit time of conductors 102 and 104, which can be very fast. In other embodiments, other mechanisms are used to sample the comparator output.

In decision block 260, a determination is made whether the comparator output has changed state. If this is the first time through loop 215, then the result is "NO," and control continues with action 270. If this is not the first time through loop 215, then the comparator output is compared against the state of the comparator output from the last time through the loop. If the comparator output has changed state, then the impedance values are satisfactorily set, and the method is done at action 280. If the comparator output has not changed state, then the impedance values are not satisfactorily set, and method 200 continues with action 270.

In action 270, $R_1$ and $R_2$ are updated, and loop 215 is repeated starting with action 240. Loop 215 is repeated until the comparator output changes state, signifying that the impedance values are satisfactorily set. This will occur when $R_1$ approximates $Z_0$, thereby providing a termination that closely approximates the actual characteristic impedance of the conductors. Action 270 corresponds to control circuit 114 changing the signal values on node 117, which in turn changes the impedance values of variable impedance termination devices 128 and 130.

As an example of the operation of method 200, assume that $I_{out}$=20 milliamps (mA), $Z_0$=50 ohms, $R_1$ is initialized to 25 ohms, and $R_2$ is initialized to 50 ohms. When the first data edge is sent from the near end, a 20 mA differential current is driven by driver 124 in a parallel combination of 50 ohms ($Z_0$) and 25 ohms ($R_1$). The equivalent impedance driven by driver 124 is substantially 17 ohms, and a 340 millivolt (mV) differential voltage develops on nodes 144 at the input to differential receiver 140. At the same time, driver 126 drives $I_{out}/4$, or 5 mA, into an impedance of 50 ohms ($R_2$), and develops a differential voltage of 250 mV on nodes 148 at the input to differential receiver 140. Differential receiver 140 compares 340 mV on nodes 144 to 250 mV on nodes 148, and outputs a logic state of "1" to indicate that nodes 144 have a greater voltage than nodes 148.

As method 200 continues, and loop 215 is repeated, $R_1$ and $R_2$ are incrementally increased in impedance by action 270. As long as $R_1$ is less than $Z_0$, the output of the comparator (differential receiver 140) does not change state. When $R_1$ reaches 50 ohms and $R_2$ reaches 100 ohms, both inputs to differential receiver 140 have a voltage of 500 mV. Nodes 144 have a current of 20 mA conducting through an equivalent impedance of 25 ohms, and nodes 148 have a current of 5 mA conducting through an impedance of 100 ohms. When this point is passed, the comparator output will change state, and method 200 will be done. The closeness of the impedance match between $R_1$ and $Z_0$ is affected, in part, by any offset of the differential receiver and the resolution of the variable impedance devices.

In some embodiments, method 200 is repeated for each integrated circuit on the simultaneous bidirectional bus. For example, method 200 can be performed as explained above to set the variable impedance termination devices in integrated circuit 110. Then, method 200 can be repeated to set the variable impedance termination devices in integrated circuit 160. When method 200 is repeated to set the variable impedance termination devices in integrated circuit 160, the near side driver is driver 174, and the far side driver is driver 124. Method 200 can be repeated as many times as necessary to set all of the variable impedance termination devices in a system. In some embodiments, method 200 is performed only twice. In these embodiments, all of the variable impedance devices in one integrated circuit are set when method 200 is performed a first time, and all of the variable impedance termination devices in a second integrated circuit are set when method 200 is performed a second time. In other embodiments, method 200 is performed more than twice.

Figure 3:
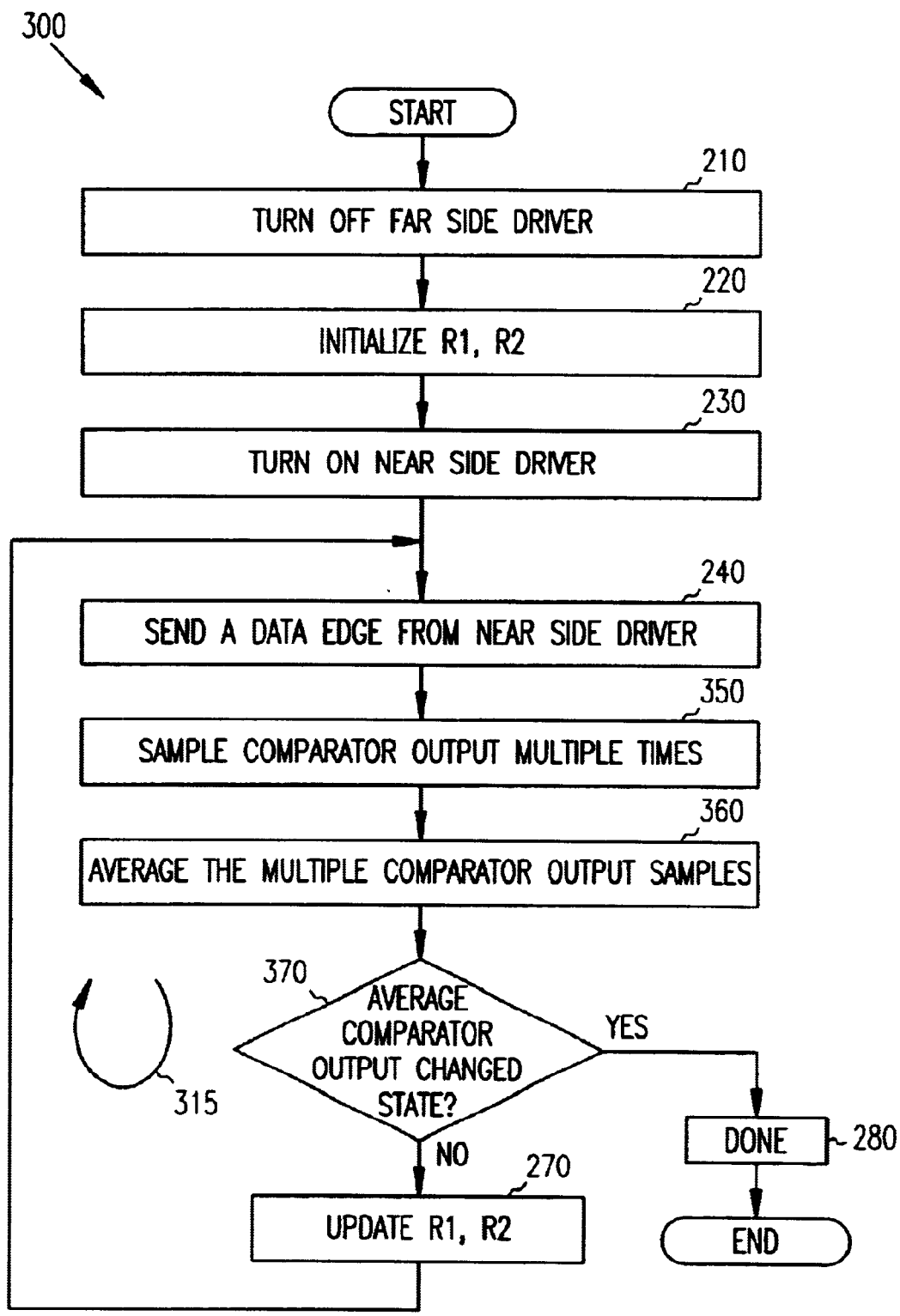
FIG. 3 shows another flowchart of a method to set the termination impedance in a simultaneous bidirectional port circuit.

FIG. 3 shows another flowchart of a method to set the termination impedance in a simultaneous bidirectional port circuit. The method embodiments represented by FIG. 3 are similar to the method embodiments of FIG. 2 in many respects. For example, actions 210, 220, and 230 are shown in both method 200 (FIG. 2) and method 300 (FIG. 3). These actions are outside loop 315. The actions inside loop 315 are not all the same as loop 215 (FIG. 2).

Loop 315 includes actions 240, 350, 360, 270, and decision block 370. In action 240, a data edge is sent from the near side driver. This results in a signal transition from driver 124 (FIG. 1) traveling down conductors 102 and 104. In action 350, the comparator output is sampled multiple times prior to the round-trip transit time, and in action 360, the comparator output samples are averaged to create a comparison average. It is this comparison average that is checked in decision block 370, rather than a single comparator output sample as in method 200.

Averaging multiple comparator output samples can be useful in situations where a single sample might be undesirable. For example, if a system noise spike causes an erroneous comparator reading, a single sample might cause the method to end early and set the variable impedance termination devices to an undesirable impedance value. Also for example, transmission lines that have a varying characteristic impedance, or "impedance discontinuities," along their length, may produce signal reflections prior to the round-trip transit time. A signal reflection resulting from an impedance discontinuity can cause a comparator output sample to be non-representative of the actual transmission line characteristics. A comparison average can be useful to "average out" these transmission line discontinuities, and to set the variable impedance termination devices to desirable values.

Figure 4:
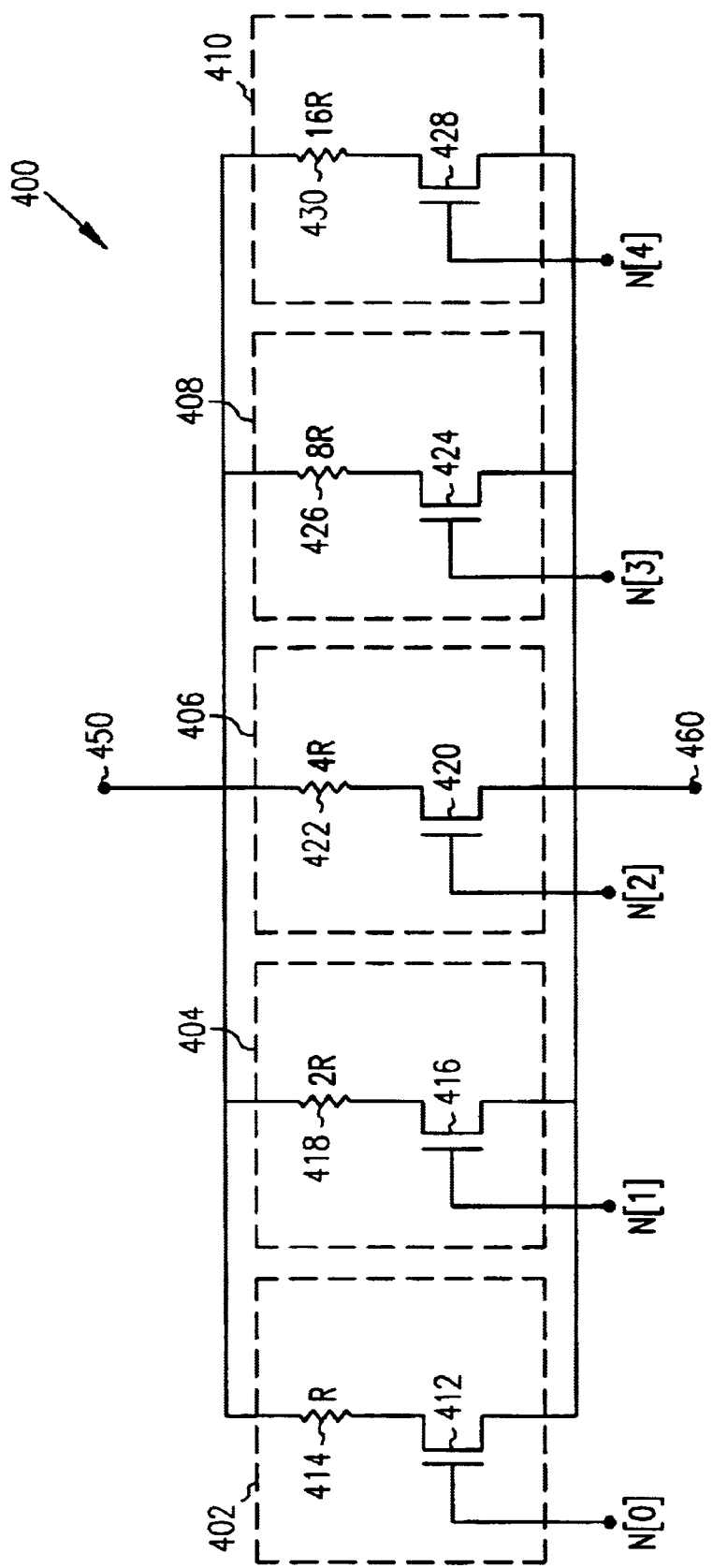
FIG. 4 shows a variable impedance device.

FIG. 4 shows a variable impedance device suitable for use as variable impedance termination devices 128 and 130 (FIG. 1). Variable impedance device 400 includes multiple resistive devices, each having a control input node. For example, variable impedance device 400 includes resistive devices 402, 404, 406, 408, and 410. Each of the resistive devices includes a transistor and a fixed value resistor. For example, resistive device 402 includes NFET 412 and resistor 414. Likewise, resistive devices 404, 406, 408, and 410 include NFETs 416, 420, 424, and 428 and resistors 418, 422, 426, and 430, respectively.

In embodiments represented by FIG. 4, transistors 412, 416, 420, 424, and 428 are N-channel metal oxide semiconductor field effect transistors (NMOSFETs), also referred to as "NFETs." Other types of transistors can also be used. For example, embodiments exist that utilize bipolar junction transistors (BJTs) and junction field effect transistors (JFETs). One of ordinary skill in the art will understand that many other types of transistors can be utilized without departing from the scope of the present invention.

Each resistive device is coupled in parallel between two reference nodes 450 and 460. Reference nodes 450 and 460 correspond to the nodes between which the variable impedance device is connected. For example, when two variable impedance devices 400 are used as variable impedance termination devices 128 (FIG. 1), node 450 is coupled to one of nodes 144, and node 460 is coupled to a reference potential. Each resistive device also includes a control input node to accept a signal that either turns on or turns off the NFET. For example, NFET 412 within resistive-device 402 has a gate driven with a signal on control node 432. Likewise, control nodes 434, 436, 438 and 440 provide control signals to NFETs 416, 420, 424, and 428, respectively.

The resistors within the resistive devices can be any type of resistor fabricated on an integrated circuit. In some embodiments, resistors are fabricated as N-well resistors, as is known in the art. In the embodiment shown in FIG. 4, the resistive devices have binary weighted resistance values. For example, resistor 414 has a resistance value of "r," and resistor 418 has a resistance value of "2r." The resistance values double for each resistive device, and the largest resistance value of "16r" exists in resistive device 410.

Control input nodes 432, 434, 436, 438, and 440, taken together, form a control bus. In the embodiment of FIG. 4, this control bus is driven by a five bit wide signal labeled N[4:0]. In embodiments that utilize variable impedance device 400 for variable impedance termination devices 128 (FIG. 1), the five bit wide signal N[4:0] corresponds to an impedance control signal on node 117. By varying which control signals are asserted, 31 different resistance values can be obtained between nodes 450 and 460.

Variable impedance device 400 has been described with resistive devices, each including a resistor with a binary weighting relative to the other resistors. Any number of resistive devices can be included without departing from the scope of the present invention. Binary weighting can be maintained with a large number of resistive devices, or a linear weighting can be employed. For example, variable impedance device 400 can be implemented with each resistive device including a resistor of equal value. This reduces the number of possible resistance values available, but also reduces the possibility of a transient resistance value appearing when signal values on the input bus change.

Figure 5:
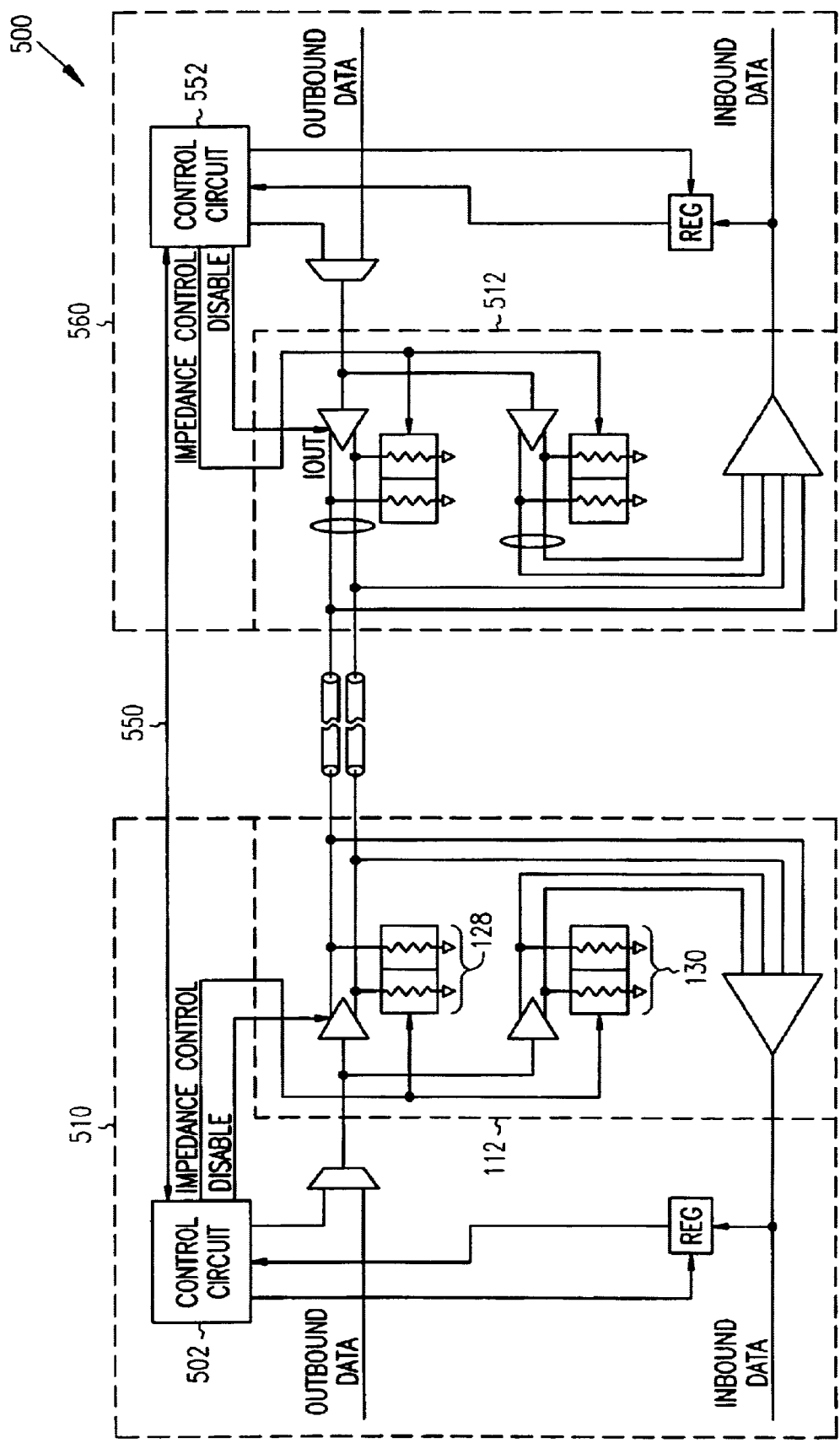
FIG. 5 shows another electronic system having two integrated circuits with simultaneous bidirectional port circuits.

FIG. 5 shows another electronic system having two integrated circuits with simultaneous bidirectional port circuits. System 500 includes integrated circuits 510 and 560. Integrated circuit 510 includes simultaneous bidirectional port circuit 112 and control circuit 502. Integrated circuit 560 includes bidirectional port circuit 512 and control circuit 552. In some embodiments, bidirectional port circuits 112 and 512 are the same as those shown in FIG. 1. Variable impedance termination devices 128 within bidirectional port circuit 112 are set by control circuit 502, and variable impedance termination devices within bidirectional port circuit 512 are set by control circuit 552.

Control circuits 502 and 552 are coupled to each other by node 550. In embodiments represented by FIG. 5, control circuits 502 and 552 can use node 550 to communicate during the time that the termination impedance devices are set. For example, control circuit 502 can alert control circuit 552 when control circuit 502 is going to set the values of variable impedance termination devices 128 and 130. In response, control circuit 552 can disable the far end driver and set the far end terminations accordingly.

Embodiments represented by FIG. 5 provide a mechanism for integrated circuits 510 and 560 to communicate without using a processor during the setting of terminations. Node 550 provides a "back-channel" that supports this communication. In some embodiments, the back-channel operates at a much slower speed than the simultaneous bidirectional interface, and without termninations. This allows the back-channel to reliably communicate prior to the setting of the variable impedance termination devices.

Integrated circuits 510 and 560 (and 110 and 160 of FIG. 1) can be any type of integrated circuit capable of including simultaneous bidirectional port circuits. For example, the integrated circuits can be processors such as microprocessors, digital signal processors, microcontrollers, or the like. Integrated circuits 110, 160, 510, and 560 can also be integrated circuits other than a processor such as an application-specific integrated circuit (ASIC), a communications device, a memory controller, or a memory such as a dynamic random access memory (DRAM).

Systems 100 (FIG. 1), 500 (FIG. 5), and other system embodiments of the present invention can be personal computers (PC), servers, mainframes, handheld devices, portable computers, set-top boxes, or any other systems that includes variable impedance termination devices.

Figure 6:
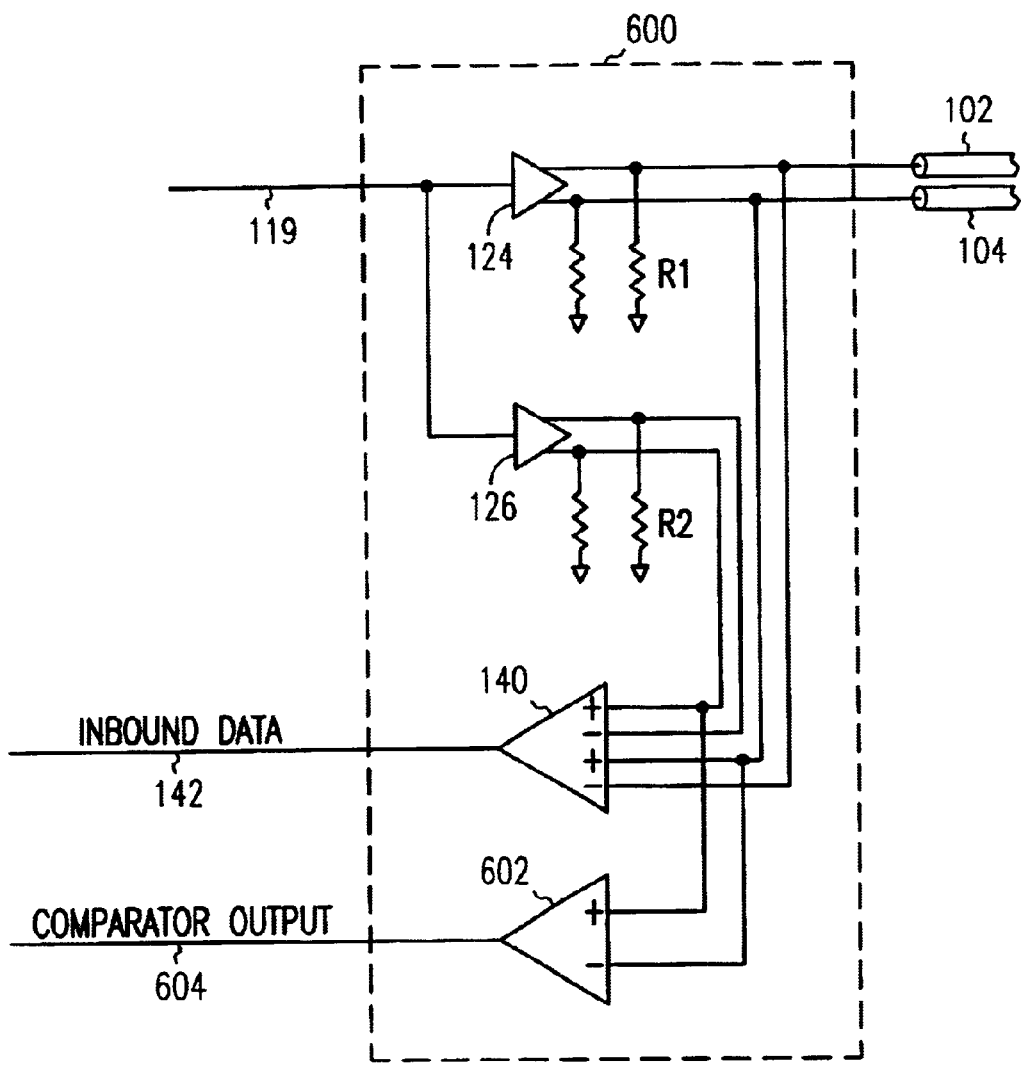
FIG. 6 shows a simultaneous bidirectional port circuit.

FIG. 6 shows a simultaneous bidirectional port circuit. Simultaneous bidirectional port circuit 600 includes current mode driver 124, current mode return driver 126, differential receiver 140, variable impedance termination devices 128 and 130, and comparator 602. In embodiments represented by FIG. 6, inbound data is provided on node 142 by differential receiver 140, and the comparator output is provided on node 604 by comparator 602. Comparator 602 is a two-input comparator that performs a single-ended comparison rather than a differential comparison as described above with reference to FIGS. 1 and 5. In embodiments represented by FIG. 6, the control circuit (not shown) samples the output of comparator 602 when performing the methods described above with reference to FIGS. 2 and 3.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. A method comprising:
    transmitting a first current signal to a parallel combination of a first termination impedance and a transmission line;
    transmitting a second current signal to a second termination impedance;
    comparing a first voltage on the first termination impedance to a second voltage on the second termination impedance; and
    modifying the first termination impedance.

2. The method of claim 1 further comprising modifying the second termination impedance.

3. The method of claim 1 wherein the transmission line has a round-trip transit time, and comparing comprises comparing prior to the round-trip transit time.

4. The method of claim 3 further comprising:
    comparing the first voltage to the second voltage more than once prior to the round-trip transit time to produce a plurality of comparisons;
    averaging the plurality of comparisons to create a comparison average; and
    modifying the first termination in response to the comparison average.

5. The method of claim 1 further comprising initializing the first termination impedance to a value below an impedance of the transmission line and wherein modifying comprises increasing the first termination impedance.

6. The method of claim 5 further comprising repeating the actions of transmitting the first and second current signals, comparing, and modifying, until the comparing action yields a different result.

7. The method of claim 1 wherein the first current signal and the second current signal are of different amplitudes.

8. The method of claim 7 wherein the amplitude of the first current signal is substantially four times the amplitude of the second current signal.

9. The method of claim 1 wherein the first and second termination impedances are different impedances.

10. The method of claim 9 wherein the second termination impedance is substantially twice the first termination impedance.

11. An article comprising a machine-readable medium with instructions encoded thereon, the instructions when executed operable to cause a computerized system to perform:
    turning off a first current driver coupled to a transmission line;
    turning on a second current driver coupled to the transmission line;
    comparing a voltage on an output node of the second current driver to a second voltage; and
    modifying a termination impedance on the output node of the second current driver.

12. The article of claim 11, the instructions when executed further operable to cause the computerized system to perform turning off a first current driver, turning on a second current driver, comparing a voltage, and modifying a termination impedance until comparing the voltage yields a different result.

13. The article of claim 11 wherein comparing comprises comparing the voltage to the second voltage multiple times prior to a round-trip transit time of the transmission line.

14. The article of claim 11 wherein the first current driver is in a first integrated circuit and the second current driver is in a second integrated circuit, and turning off a first current driver comprises sending a command to the first integrated circuit.

15. The article of claim 14 wherein turning on the second current driver comprises sending a command to the second integrated circuit.

16. The article of claim 11 further comprising sending a data edge from the second current driver substantially simultaneously with a third current driver.

17. The article of claim 16 wherein comparing comprises comparing the voltage on the output node of the second current driver to a voltage on an output node of the third current driver.

18. The article of claim 17, the instructions when executed further operable to cause the computerized system to perform modifying a termination impedance on the output node of the third current driver.

19. An integrated circuit comprising:
a first differential current driver having an output node;
a first variable impedance termination device coupled to the output node of the first differential current driver;
a second differential current driver having an output node;
a comparator coupled to the output nodes of the first and second differential current drivers; and
a control circuit to modify the first variable impedance termination device responsive to the comparator.

20. The integrated circuit of claim 19 further comprising an external node coupled to the output node of the first differential current driver.

21. The integrated circuit of claim 19 further comprising a processor interface circuit coupled to the control circuit to receive commands from a processor.

22. The integrated circuit of claim 19 wherein the control circuit is configured to command the first and second differential current drivers to drive a first and second current, respectively.

23. The integrated circuit of claim 22 wherein the control circuit is further configured to sample an output node of the comparator.

24. The integrated circuit of claim 19 further comprising a second variable impedance termination device coupled to the output node of the second differential current driver.

25. The integrated circuit of claim 24 wherein:
the first differential current driver includes circuitry to source a first differential current;
the second differential current driver includes circuitry to source a second differential current; and
the first differential current is larger than the second differential current, and an impedance value of the first variable impedance termination device is smaller than an impedance value of the second variable impedance termination device.

26. An electronic system comprising:
a pair of conductors;
a first integrated circuit including a first current mode driver having a differential output node coupled to a first end of the pair of conductors, a first pair of variable impedance termination devices coupled to the differential output node of the first current mode driver, a second current mode driver having a differential output node, a comparator having input nodes coupled to the differential output nodes of the first and second current mode drivers, and a control circuit to influence the first pair of variable impedance termination devices responsive to the comparator; and
a second integrated circuit having a third current mode driver coupled to a second end of the pair of conductors.

27. The electronic system of claim 26 wherein the first integrated circuit includes a processor interface circuit to couple the control circuit to a processor.

28. The electronic system of claim 27 further comprising a processor coupled to the first and second integrated circuits, wherein the processor is configured to command the second integrated circuit to turn off the third current mode driver, and to command the first integrated circuit to turn on the first and second current mode drivers and change the first pair of variable impedance termination devices in response to the comparator.

29. The electronic system of claim 26 wherein the first integrated circuit further comprises a second pair of variable impedance termination devices coupled to the differential output node of the second current mode driver.

30. The electronic system of claim 29 wherein the control circuit is configured to influence the second pair of variable impedance termination devices responsive to the comparator.

* * * * *